United States Patent
Nebendahl

(10) Patent No.: US 6,795,454 B2
(45) Date of Patent: Sep. 21, 2004

(54) TUNING A LASER

(75) Inventor: Bernd Nebendahl, Ditzingen (DE)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/100,975

(22) Filed: Mar. 19, 2002

(65) Prior Publication Data

US 2002/0181517 A1 Dec. 5, 2002

(30) Foreign Application Priority Data

Jun. 1, 2001 (EP) .............................. 01113371

(51) Int. Cl.[7] .............................. H01S 3/00; H01S 3/08
(52) U.S. Cl. .......................................... 372/20; 372/92
(58) Field of Search .............................. 372/20, 92, 97, 372/96, 99, 102

(56) References Cited

U.S. PATENT DOCUMENTS

| | | | |
|---|---|---|---|
| 5,319,668 A | 6/1994 | Luecke | 372/107 |
| 5,867,512 A | 2/1999 | Sacher | 372/20 |
| 6,304,586 B1 | 10/2001 | Pease et al. | 372/38.02 |

FOREIGN PATENT DOCUMENTS

JP   05267768   10/1993

OTHER PUBLICATIONS

Classen, L., Examiner. European Search Report, Application No. EP 01 11 3371, dated Dec. 18, 2002.
Wandt, D. et al. "Continuously Tunable External–Cavity Diode Laser With a Double–Grating Arrangement," Optics Letters, Optical Society of America, XP 000690335, vol. 22, No. 6, Washington, U.S., Mar. 15, 1997, pp. 390–392.
Wenz et al, "Continuously Tunable Diode Laser", Laser und Optoelektronik, vol. 28, No. 1, Feb. 1, 1996, pp. 58–62. (only English abstract).

*Primary Examiner*—Quyen Leung

(57) ABSTRACT

A method and an apparatus for tuning a laser includes creating a laser with a path between a cavity end element and a tuning element of an external cavity, both being a high reflective or semitransparent mirror, selecting at least one longitudinal mode of the laser by introducing a dispersion element in the path of the laser, rotating the tuning element about a pivot axis theoretically defined by the intersection of the surface planes of the cavity end element, the dispersion element and the tuning element to tune the laser. The method and apparatus also include provisions for moving the dispersion element along such a predetermined path to at least partly compensate a shift between the real position of the pivot axis and the theoretically defined position.

18 Claims, 2 Drawing Sheets

TUNING A LASER

BACKGROUND OF THE INVENTION

The present invention relates to laser tuning.

In the optical communication industry there is a need for testing optical components and amplifiers with lasers that can be tuned in wavelength continuously without mode hopping. To perform these tests Littman cavities can be used as external cavities to allow single-mode tuning of the laser. The geometry of these cavities is known, see e.g.: Liu and Littman, "Novel geometry for single-mode scanning of tunable lasers", Optical Society of America, 1981, which article is incorporated herein by reference. The advantage of the Littman cavity is that it is possible to tune the wavelength and the optical length of the cavity at the same time by changing only one parameter of the geometry, i.e. the tuning element.

Examples of tunable lasers, in particular based on the Littman geometry, can be found e.g. in U.S. Pat. No. 5,867,512, DE-A-19509922, Wenz H. et al: "Continuously Tunable Diode Laser" in 'Laser und Optoelekronik' (Fachverlag GmbH, Stuttgart, DE, Vol.28 No.1, p.58–62, Feb. 1, 1996, XP000775842, ISSN: 0722-9003), Wandt D. et al: "Continuously Tunable External-Cavity Diode Laser with a Double-Grating Arrangement" (Optics Letter, Optical Society of America, Washington, US, vol.22, no.6, Mar. 15, 1997, pages 390–392, XP000690335, ISSN: 0146-9592), DE-A19832750, EP-A-938171, JP-A-05 267768, or U.S. Pat. No. 5,319,668.

The Littman geometry, however, is extremely sensible to deviations of the real geometry with respect to the perfect Littman configuration. This does impose severe requirements on the rotation mount for the tuning element of the Littman cavity. Smallest errors in the positioning of the pivot axis of the tuning element reduce the mode hop free tuning range of the cavity heavily. This requires costly precision when manufacturing and maintaining such tunable lasers.

SUMMARY OF THE INVENTION

Therefore, it is an object of the invention to provide improved tuning of a laser. The object is solved by the independent claims.

An advantage of the present invention is the provision of a tunable laser that autonomously and easily compensates for deviations, e.g. a shift of the real position of the pivot axis of the tuning element with respect to the theoretical perfect position of the pivot axis. This compensation is sufficient to provide continuous single-mode tuning within a predetermined tuning range of the tuning element. The compensation is done by moving the dispersion element, preferably along a predetermined path, corresponding with the rotation of the tuning element. Therefore, method and an apparatus of the present invention for tuning of lasers avoid the aforementioned problems of the prior art and provide a tunable laser with a wide mode hop free tuning range without heavy duties to the precision when manufacturing and maintaining such laser.

In a preferred embodiment of the present invention the moving of the dispersion element is done simultaneously with the rotation of the tuning element. This achieves an online correction, so that always the correct position of the dispersion element for the full feedback of the tuning element is guaranteed.

In another preferred embodiment of the invention the correction is done by moving the dispersion element by rotating it by a predetermined rotating angle about a predetermined rotating axis. This way of correction can be easily implemented in the inventive apparatus, e.g. by using a piezo-electric driven rotation stage that can precisely move the respective tuning element of the laser.

In yet another preferred embodiment of the invention the correction is done by a dispersion element which is a diffraction grating and in which the rotating axis is at least not perpendicular, more preferred parallel, to the axes of the rules of the grating. This positioning serves for maximum efficiency of the inventive method and apparatus.

In another preferred example of the invention the method further comprises steps for at least approximately evaluating a function which determines the rotating angle of the dispersion element for generating mode or wavelength hop free rotating of the tuning element within a predetermined tuning range of the tuning element per rotation angle of the tuning element. This evaluation is done by the following steps: step a: substantially detecting mode or wavelength hops during rotation of the tuning element, step b: rotating the tuning element about a predetermined angle until at least one mode or wavelength hop substantially has occurred, step c: rotating the dispersion element about an arbitrary angle, step d: rotating back the tuning element about the predetermined angle of step a, and repeating steps a to d with increasing or decreasing rotating angle of step c until substantially no mode or wavelength hops during rotation of the tuning element are detected in step b, and using the overall rotating angle of step c per rotating angle of step b to evaluate an approximation of the function which determines the rotating angle of the dispersion element per rotating angle of the tuning element. This can be done fast and easy so that a quick adjustment of the apparatus for full feedback of the tuning element is achieved.

After performing the above described determination it is preferred to move the dispersion element according to the approximation function before or while rotating the tuning element.

Other preferred embodiments are shown by the dependent claims.

It is clear that the invention can be partly embodied or supported by one or more suitable software programs, which can be stored on or otherwise provided by any kind of data carrier, and which might be executed in or by any suitable data processing unit.

BRIEF DESCRIPTION OF THE DRAWINGS

Other objects and many of the attendant advantages of the present invention will be readily appreciated and become better understood by reference to the following detailed description when considering in connection with the accompanied drawings. The components in the drawings are not necessarily to scale, emphasis instead being placed upon clearly illustrating the principles of the present invention. Features that are substantially or functionally equal or similar will be referred to with the same reference sign(s).

DETAILED DESCRIPTION OF THE INVENTION

Figure 1:
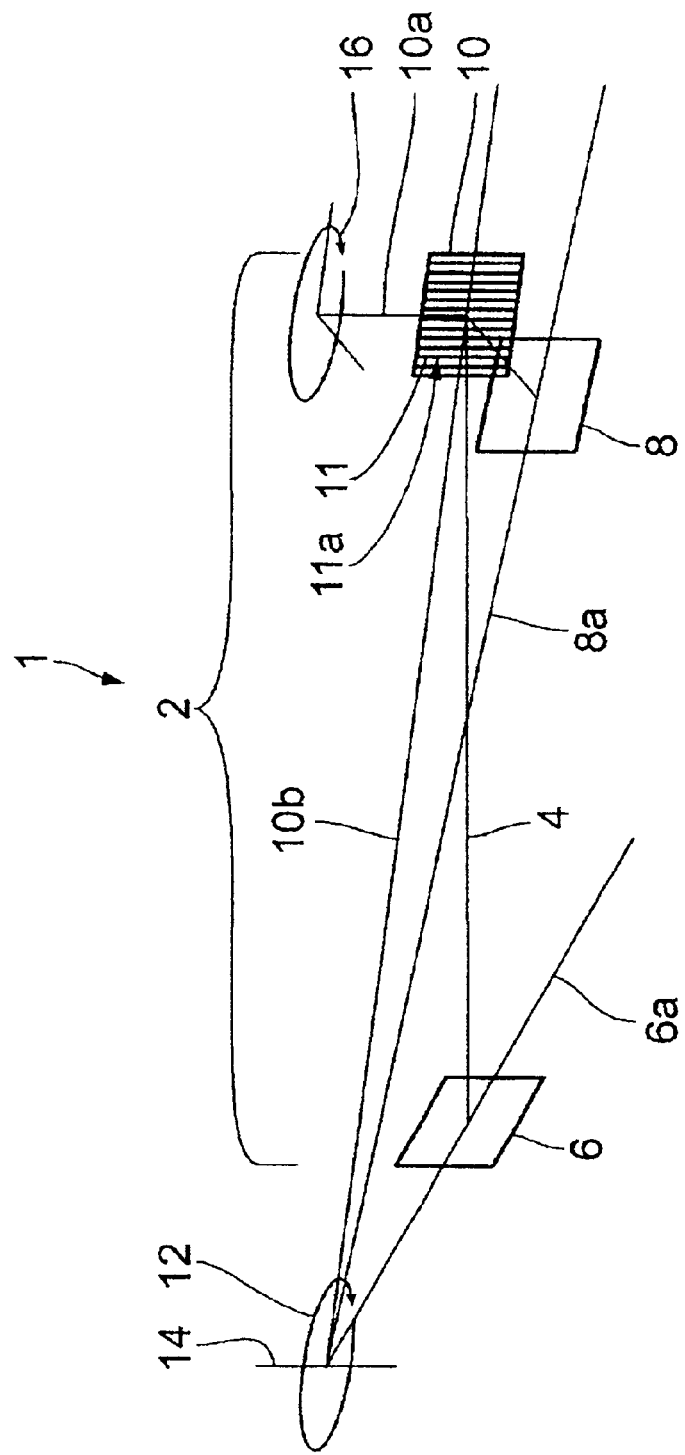
FIG. 1 shows a schematic view of a first embodiment of the apparatus of the present invention.

Referring now in greater detail to the drawings, FIG. 1 shows a schematic view of a first embodiment 1 uof the apparatus of the present invention. The apparatus 1 of FIG. 1 comprises an external cavity 2 in which laser light provided by an active medium (not shown), e.g. a laser diode, can resonate to provide a laser beam 4. The beam 4 travels in the cavity 2 along a path between a cavity end element 6 and a tuning element 8 of the external cavity 2. The cavity end element 6 and the tuning element 8 both providing a high reflective mirror. The apparatus 1 further comprises a dispersion element 10 introduced in the path of the beam 4 for selecting at least one longitudinal mode of the laser. The dispersion element comprises a grating 11 having rules 11*a*.

The tuning element 8 can be rotated by an actuator (not shown) according to arrow 12 about a pivot axis 14 to tune the laser. The pivot axis 14 is theoretically defined by the intersection of the surface plane (indicated by line 6*a*) of the cavity end element 6, the surface plane (indicated by line 10*b*) of the dispersion element 10 and the surface plane (indicated by line 8*a*) of the tuning element 8.

The dispersion element 10 is mounted on one end of an electrically driven bimorph type piezo-electric element (not shown) which serves as the moving element of the invention. One end of the bimorph type piezo-electric element is freely slewable whereas the other end of the bimorph type piezo-electric element is fixed relative to the cavity 2.

The bimorph type piezo-electric element allows moving the dispersion element 10 corresponding, preferably simultaneously with the rotation of the tuning element 8 to compensate a shift between the real position of the pivot axis 14 and the theoretically defined position. This is done preferably by moving the dispersion element 10 along such a predetermined path that the compensation is sufficient to provide continuous single-mode tuning within a predetermined tuning range of the tuning element 8. Moving the dispersion element 10 in this embodiment means rotating the dispersion element 10 according to arrow 16 by a predetermined rotation angle (for the predetermination of the rotation angle see below) about the rotating axis 10*a* which is substantially parallel to the rules 11 a and substantially lies in the plane of the grating 11.

The apparatus of FIG. 1 preferably further comprises as a measuring device a wire strain gauge (not shown) for measuring the rotating angle 16 of the rotating of the dispersion element 10 and to output a measured value of the rotating angle 16, a comparator (not shown) connected with the wire strain gauge for comparing the measured value of the rotating angle 16 with the predetermined value of the rotating angle 16 and to output a signal indicating a difference between the measured value and the predetermined value of the rotating angle 16, a controller (not shown) connected with the output of the comparator and with the moving element for adjusting the rotating angle 16 when the comparator has detected a difference between the measured value and the predetermined value.

For the above mentioned predetermination of the predetermined value of the rotating angle 16 of the dispersion element 10 the following steps can be performed: step a: substantially detecting mode or wavelength hops during rotation of the tuning element 8, step b: rotating the tuning element 8 about a predetermined angle 12 until at least one mode or wavelength hop substantially has occurred, step c: rotating the dispersion element 10 about an arbitrary angle 16, step d: rotating back the tuning element 8 about the predetermined angle 12 of step a, and repeating steps a to d with increasing or decreasing rotating angle 16 of step c until substantially no mode or wavelength hops during rotation of the tuning element 8 are detected in step b, and using the overall rotating angle 16 of step c per rotating angle 12 of step b to evaluate an approximation of the function which determines the rotating angle 16 of the dispersion element 10 per rotating angle 12 of the tuning element 8. The approximation can be done by known approximation methods. The more repeats of steps a to d are performed the more exact is the predetermination.

Figure 2:
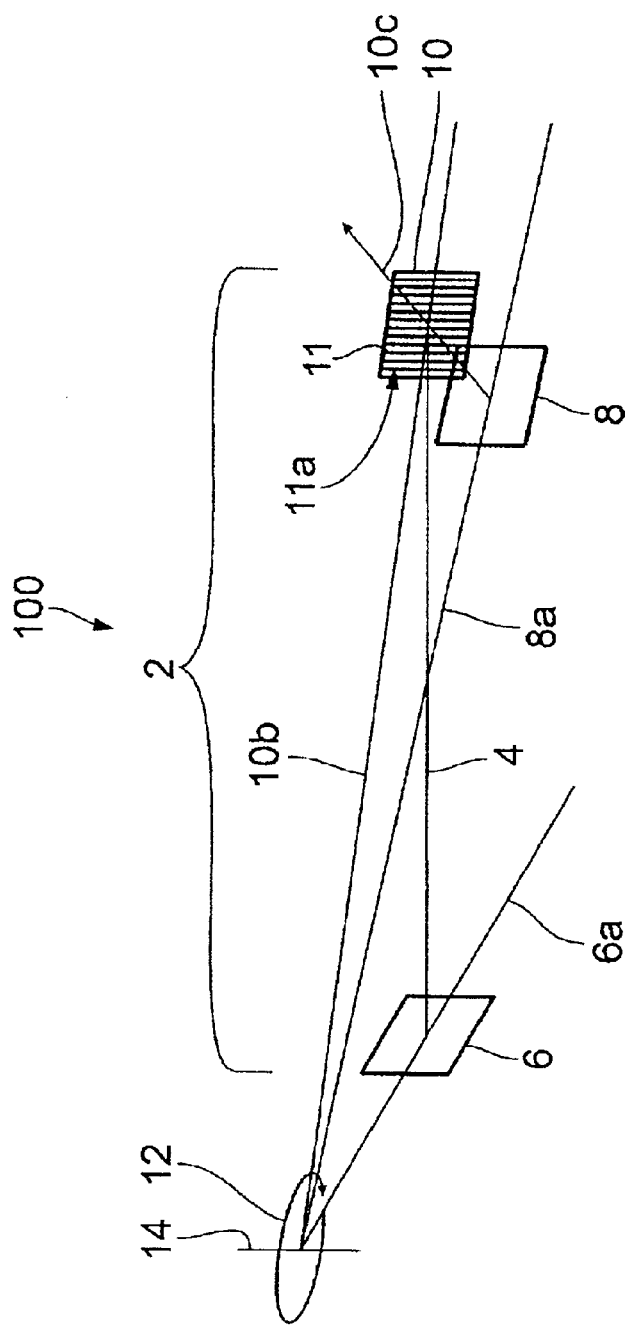
FIG. 2 shows a schematic view of a second embodiment of the apparatus of the present invention.

FIG. 2 shows a schematic view of a second embodiment 100 of the apparatus of the present invention. Basically the embodiment of FIG. 2 works the same way the embodiment of FIG. 1 does. However, in embodiment 100 there is no rotation axis 10*a* to rotate the grating 11. Instead the grating 11 is linearly moved along the axis 10*c* which is perpendicular to the grating 11 and lies in the plane of the axis 10*b* and 8*a*. The linear move of the grating 11 serves also to compensate a shift between the real position of the pivot axis 14 and the theoretically defined position. The linear moving of the dispersion element 10 has to be done along such a predetermined length of the path that the compensation is sufficient to provide continuous single-mode tuning within a predetermined tuning range of the tuning element 8 (for the predetermination of the rotation angle see below).

The apparatus of FIG. 2 also comprises as a measuring device a wire strain gauge (not shown) for measuring the length of the move of the dispersion element 10 along axis 10*c* and to output a measured value of the length, a comparator (not shown) connected with the wire strain gauge for comparing the measured value of the length with the predetermined value of the length and to output a signal indicating a difference between the measured value and the predetermined value of the length, a controller (not shown) connected with the output of the comparator and with the moving element for adjusting the length of the move when the comparator has detected a difference between the measured value and the predetermined value.

Similarly to the embodiment of FIG. 1, for the above mentioned predetermination of the predetermined value of the length of the move of the dispersion element 10 the following steps are performed: step a: substantially detecting mode or wavelength hops during rotation of the tuning element 8 about axis 14, step b: rotating the tuning element 8 about a predetermined angle 12 about axis 14 until at least one mode or wavelength hop substantially has occurred, step c: moving the dispersion element 10 along an arbitrary length along axis 10*c*, step d: rotating back the tuning element 8 about axis 14 about the predetermined angle 12 of step a, and repeating steps a to d with increasing or decreasing moving length along axis 10*c* of step c until substantially no mode or wavelength hops during rotation of the tuning element 8 are detected in step b, and using the overall moving length of step c per rotating angle 12 of step b to evaluate an approximation of the function which determines the moving length along axis 10*c* of the dispersion element 10 per rotating angle 12 of the tuning element 8. The approximation can be done by known approximation methods. The more repeats of steps a to d are performed the more exact is the predetermination. It is clear that the positioning of the axes 14, 6*a*, 8*a*, 10*a*, 10*b*, 10*c* according to the FIGS. 1 and 2 only show the ideal case of the positioning of the axes 14, 6*a*, 8*a*, 10*a*, 10*b*, 10*c*. The axes 14, 6*a*, 8*a*, 10*a*, 10*b*, 10*c* however can be positioned in another way, i.e. in other angles or positions as shown in FIGS. 1 and 2, e.g. in other angles relative to the cavity end element 6, the tuning element 8 and/or the dispersion element 10. Moreover, the axes 14, 6*a*, 8*a*, 10*a*, 10*b*, 10*c* can be combined with each other.

Additionally, it is possible to have variations in the position of the axes 14, 6*a*, 8*a*, 10*a*, 10*b*, 10*c* during the rotation about the axes 14 or 10a respectively the movement along axis 10c. E.g. these variations can be caused by the piezo-electric element or rotation stage for rotating the cavity end element 6, the tuning element 8 or the dispersion element 10 respectively the movement of the dispersion element 10. However, these variations can be corrected by calibrating the inventive apparatus 1 or 2.

What is claimed:

1. A method of tuning a laser, comprising:
   providing a laser beam to a path between a cavity end element and a tuning element of an external cavity;
   selecting a mode of said laser by introducing a dispersion element in said path;
   rotating said tuning element about a pivot axis to tune said laser, wherein said pivot axis is defined by an intersection of a surface plane of said cavity end element, a surface plane of said dispersion element, and a surface plane of said tuning element; and
   moving said dispersion element to at least partly compensate a shift between a real position of said pivot axis and said intersection, wherein said moving of said dispersion element is executed corresponding with said rotating of said tuning element.

2. The method of claim 1, wherein said moving said dispersion element is executed simultaneously with said rotating of the tuning element.

3. The method of claim 1, wherein said moving said dispersion element comprises shifting said dispersion element along a predetermined path by a predetermined distance.

4. The method of claim 3, wherein said predetermined path is a substantially linear path.

5. The method of claim 1, wherein said moving said dispersion element comprises rotating said dispersion element by a predetermined rotating angle about a predetermined rotating axis.

6. The method of claim 5, further comprising:
   at least approximately evaluating a function that determines said predetermined rotating angle of said dispersion element for generating mode or wavelength hop free rotating of said tuning element within a predetermined tuning range of said tuning element per rotation angle of said tuning element, by:
   substantially detecting mode or wavelength hops during said rotating of said tuning element and;
   rotating said tuning element about a predetermined angle until at least one mode or wavelength hop substantially has occurred;
   rotating said dispersion element about an arbitrary angle;
   rotating back said tuning element about the predetermined angle;
   repeating substantially detecting mode or wavelength hops, rotating said tuning element about a predetermined angle, rotating said dispersion element, and rotating back said tuning element about said predetermined angle, while increasing or decreasing said arbitrary angle until substantially no mode or wavelength hops are detected while rotating said tuning element about said predetermined angle, and
   using an overall arbitrary angle per predetermined angle to evaluate an approximation of said function that determines said rotating angle of said dispersion element per rotating angle of said tuning element.

7. The method of claim 6, further comprising moving said dispersion element according to said approximation of said function before or while rotating said tuning element.

8. The method of claim 1, further comprising:
   measuring a rotating angle of a rotating of said dispersion element,
   comparing said measured value of said rotating angle with a predetermined value, and
   adjusting said rotating angle when detecting a difference between said measured value and said predetermined value.

9. A software program or product, stored on a data carrier, for executing a method of tuning a laser when run on a data processing system, said method comprising:
   providing a laser beam to a path between a cavity end element and a tuning element of an external cavity;
   selecting a mode of said laser by introducing a dispersion element in said path;
   rotating said tuning element about a pivot axis to tune said laser, wherein said pivot axis is defined by an intersection of a a surface plane of said cavity end element, a surface plane of said dispersion element, and a surface plane of said tuning element; and
   moving said dispersion element in order to at least partly compensate a shift between a real position of said pivot axis and said intersection, wherein said moving said the dispersion element is executed corresponding with said rotating of said tuning element.

10. An apparatus for tuning a laser, comprising:
    an external cavity for receiving a laser beam in a path between a cavity end element and a tuning element of said external cavity;
    a dispersion element being introduced in said path for selecting a mode of said laser;
    a pivot axis being defined by an intersection of a surface plane of said cavity end element, a surface plane of said dispersion element, and a surface plane of said tuning element, about which pivot axis said tuning element can be rotated to tune said laser; and
    a moving element for moving said dispersion element to at least partly compensate a shift between a real position of said pivot axis and said intersection, wherein said moving element moves said dispersion element corresponding with a rotation of said tuning element.

11. The apparatus of claim 10, wherein said moving element is capable moves said dispersion element along a predetermined path such that said compensation is sufficient to provide continuous single-mode tuning within a predetermined tuning range of said tuning element.

12. The apparatus of claim 10, wherein said moving element comprises a rotating element for rotating said dispersion element by a predetermined value of an angle about a predetermined rotating axis.

13. The apparatus of claim 12, wherein said predetermined rotating axis substantially lies in said surface plane of said dispersion element.

14. The apparatus of claim 13, wherein said dispersion element comprises a diffraction grating, and wherein said rotating axis is not perpendicular to rules of said diffraction grating.

15. The apparatus of claim 14, wherein said rotating axis is substantially parallel to said rules of the grating.

16. The apparatus of claim 10, wherein said moving element comprises a piezo-electric element.

17. The apparatus of claim 16, wherein said dispersion element is mounted on said piezo-electric element, that comprises a piezo-electric driven rotation stage.

18. The apparatus of claim 10, further comprising:

a measuring device for measuring a rotating angle of a rotating of said dispersion element, a comparator connected with said measuring device for comparing a measured value of said rotating angle with a predetermined value of said rotating angle, and a controller connected with said moving element for adjusting said rotating angle when said comparator has detected a difference between said measured value and said predetermined value.

* * * * *